Aug. 3, 1965 R. A. HILLS ETAL 3,199,051
OSCILLATOR WITH FREQUENCY MODULATING IRON CORE REACTOR
Filed June 15, 1962
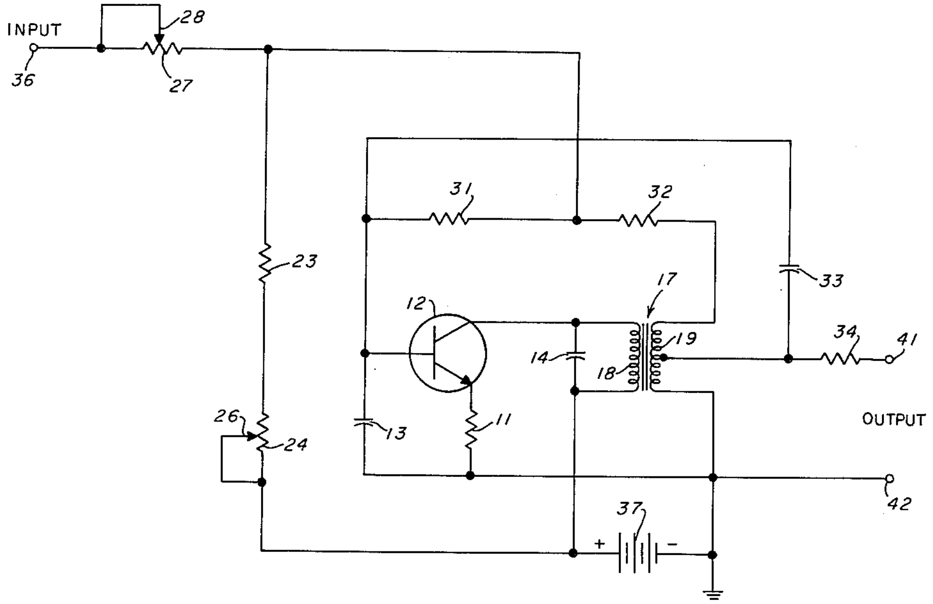
INVENTORS
RICHARD A. HILLS
FRANK C. DeBOLT
BY
Paul L. Critchlow
ATTORNEYS 3,199,051

OSCILLATOR WITH FREQUENCY MODULATING IRON CORE REACTOR

Richard A. Hills, La Jolla, Calif., and Frank C. De Bolt, Corpus Christi, Tex., assignors to the United States of America as represented by the Secretary of the Navy Filed June 15, 1962, Ser. No. 202,924
1 Claim. (Cl. 331—109)
(Granted under Title 35, U.S. Code (1952), sec. 266)

The invention described herein may be manufactured and used by or for the Government of the United States of America for governmental purposes without the payment of any royalties thereon or therefor.

This invention pertains to an oscillator and more particularly to a controllable-frequency oscillator.

A voltage-controlled oscillator is an oscillator whose frequency of oscillation can be varied by changing an applied voltage. In the past, oscillators that have been controlled in this manner have produced signals having frequencies in the radio frequency range. For example, one such oscillator comprises a free-running multivibrator with a control tube in the bias circuit. The oscillator requires a number of vacuum tubes and as the output of the multivibrator is essentially a square wave, harmonics are abundant at the oscillator output to interfere with higher bands.

It is an object of this invention to provide an improved tunable oscillator which employs few components and operates down into the entire audio band.

It is another object of the instant invention to provide an oscillator that is frequency controllable with an input signal.

It is a feature of the oscillator that the output waveform may be varied.

Other objects and many of the attendant features and advantages of the invention will be readily appreciated as the same becomes better understood by reference to the following detailed description when considered in connection with the accompanying drawing wherein:

FIG. 1 is a schematic diagram of an oscillator in accordance with the invention.

Referring to FIG. 1, a resistor 11 is connected to the emitter of an NPN transistor 12. Resistor 11 functions as a swamping resistor maintaining a relatively constant emitter current in transistor 12. It further establishes the initial operating characteristics of the active semiconductor 12.

A capacitor 13 is connected between the base of transistor 12 and one terminal of resistor 11. This resistor-capacitor junction is common to the negative terminal of a D.-C. power supply 37 and is grounded.

Serially-connected potentiometer 24 and resistors 23 and 31 are connected between the positive terminal of power supply 37 and the base of transistor 12. Collectively, these resistors help establish the base bias voltage of transistor 12.

A potentiometer 27 having a wiper 28 is connected between an input terminal 36 and the junction of resistors 23 and 31. The wiper 28 is connected to input terminal 36 so that the magnitude of current flowing through the potentiometer may be adjusted.

The collector element of transistor 12 is connected to one side of the primary winding 18 of a metal-core transformer 17 having a center-tapped secondary winding 19. As the signal level fed to the transformer may be relatively low, the transformer core material preferably has a high initial permeability, that is, the permeabiilty is high as B, the magnetic induction, and H, the magnetic force, approach zero. The inductance seen by the collector of transistor 12 helps determine the oscillating frequency of the apparatus. The inductance of primary winding 18 is directly proportional to the effective permeability of the metal core. The effective permeabiilty depends primarily on the A.-C. and D.-C. flux densities in the core. To enable large changes in the inductance of winding 18 with small changes in flux density in the core, the core material is preferably one which has a steep rise below the knee of its B-H curve or to put it another way, one that exhibits a high incremental permeability. That is, a core material wherein a small change $\Delta$ H in magnetizing force causes a large change $\Delta$ B in magnetic induction is preferred. The core material may be, for example, Hy Mu 80 manufactured by the Carpenter Steel Company, Reading, Pennsylvania. Hy Mu 80 is an unoriented alloy of nickel, iron, molybdenum, manganese, silicon and carbon which offers extremely high initial permeabiilty and maximum permeability at very low magnetizing forces with minimum hysteresis loss.

A capacitor 14 shunts primary winding 18. One terminal of capacitor 14 is connected to the positive terminal of power supply 37. Capacitor 14 and primary winding 18 form a tank circuit which fixes the base frequency of oscillation of the apparatus.

A resistor 34 is connected between the center tap of secondary winding 19 and an output terminal 41. One side of the secondary winding is grounded and connected to a second output terminal 42. Resistor 34 isolates a load attached to output terminals 41 and 42 from the rest of the circuit.

A capacitor 33 is connected between the center tap of secondary winding 19 and the junction of capacitor 13 and resistor 31. Capacitor 33 is in a regenerative feedback loop from the output of the transformer to the base of transistor 12. Capacitors 33 and 13 form a divider and capacitor 33 keeps the D.-C. voltage at the secondary winding center tap off of the base of transistor 12.

A resistor 32 is connected between one side of the secondary winding 19 and the junction of resistors 23 and 31. Resistor 32 isolates the input signal source and helps determine the magnitude of current flow through winding 19.

In operation, transistor 12 amplifies and collector current flows in the L-C tank circuit comprising primary winding 18 and capacitor 14. A feedback voltage is channeled to the base of the transistor from the secondary of transformer 17 via capacitor 33. The feedback voltage is 180 degrees out of phase with the collector voltage and, thus, causes more collector current to flow. When the transistor approaches saturation, the flow of additional collector current decreases, and the E.M.F. induced in the transformer secondary and the regenerative voltage feedback signal reverses direction. The feedback signal continues in the reverse direction and the transistor approaches cut off. When it cuts off the feedback signal once again reverses direction and collector current again flows. Basically, the transistor, connected as an amplifier, is driven to oscillation by feeding a portion of the output power back to the input. The time for a complete cycle and/or the frequency of oscillation, is determined by the capacitance of capacitor 14 and the inductance of primary winding 18. As winding 18 is wound on a metal core, its inductance is affected by the permeability of the core. The permeability of the core in turn depends on the flux density of the core. The amount of current in secondary winding 19 directly varies the flux density of the core.

A constant D.C. current flows through winding 19 via resistors 32, 23 and potentiometer 24. As wiper 26 of potentiometer 24 is moved, the D.C. current in winding 19 is varied and the permeability of the core is varied. As the inductance of winding 18 is directly proportional to the permeability of the core, the inductance of winding 18 is varied as the current in winding 19 is varied.

Thus, the basic frequency of oscillation may be varied by moving wiper 26.

When a signal, either A.-C. or D.-C. is applied to input terminal 36, additional current flows through winding 19 via potentiometer 27 and resistor 32. The additional current, caused by the input signal, changes the inductance of winding 18 and shifts the frequency of oscillation away from the base frequency. In essence, the input signal frequency modulates the base frequency of oscillation.

The shape of the output waveform produced at output terminals 41 and 42 may be varied by changing the operation point on the B-H curve of the transformer core. When operated below the knee of the curve the output waveform is sinusoidal. By operating at higher points a sawtooth waveform or a waveform similar to that produced by a single-swing blocking oscillator may be generated.

Exemplary values for the components in the circuit of FIG. 1 are as follows:

| | | |
|---|---|---|
| Resistor **11** | ohms | 400 |
| Resistor **23** | do | 56K |
| Resistor **31** | do | 80K |
| Resistor **32** | do | 43K |
| Resistor **34** | do | 22K |
| Potentiometer **23** | do | 100K |
| Potentiometer **27** | do | 100K |
| Capacitor **13** | μfd | 015 |
| Capacitor **14** | μfd | 0022 |
| Capacitor **33** | μfd | 002 |
| Transistor **12** | | 2N333 |

Transformer 17

| | |
|---|---|
| Core material | Carpenter Hy Mu 80. |
| Laminations | EI–187. |
| Turns ratio | 1:1. |
| Inductance | 1 hy. at 1 kc. |
| Power supply | 24 volts. |

It should be appreciated that a PNP transistor may be employed for transistor 12 if the polarity of the bias voltages are reversed.

Obviously, many modifications and variations of the present invention are possible in the light of the above teachings. Although the invention has been described in considerable detail, it is to be understood that such description is illustrative rather than limiting, as the invention may be variously embodied otherwise than is shown and is to be interpreted only as claimed.

What is claimed is:

A voltage-controlled oscillator comprising a transistor having a base electrode, an emitter electrode and a collector electrode, a power supply having a positive and a negative terminal, a capacitor coupled between said base electrode and said negative terminal, a resistor coupled between said emitter electrode and said negative terminal, a transformer having a saturable iron core and a primary winding and a secondary winding, said primary winding being connected between said collector electrode and said positive terminal, a capacitor connected in shunt with said primary winding, said secondary winding having a center tap, a capacitor connected between said center tap and said base electrode, two series-connected resistors connected between said base electrode and one end of said secondary winding, the other end of said secondary winding being connected to said negative terminal of said power supply, an input terminal for connection to a signal source, a resistor connected between said input terminal and the junction of said series-connected resistors, an adjustable resistor connected between said junction and said positive terminal for controlling the magnetizing current in said secondary winding, an output terminal, and a resistor connected between said output terminal and said center tap.

References Cited by the Examiner

UNITED STATES PATENTS

| | | | |
|---|---|---|---|
| 2,564,205 | 8/51 | Hugenholtz | 331—36 X |
| 2,811,639 | 10/57 | Sontheimer | 331—36 X |
| 2,919,416 | 12/59 | Jones | 332—29 |
| 2,933,697 | 4/60 | Oncley | 331—181 X |
| 3,084,294 | 4/63 | Vallese | 331—117 X |

ROY LAKE, *Primary Examiner.*

JOHN KOMINSKI, *Examiner.*